(12) United States Patent
Lukes et al.

(10) Patent No.: US 7,420,832 B1
(45) Date of Patent: Sep. 2, 2008

(54) ARRAY SPLIT ACROSS THREE-DIMENSIONAL INTERCONNECTED CHIPS

(75) Inventors: Eric John Lukes, Stewartville, MN (US); Nghia Van Phan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/741,902

(22) Filed: Apr. 30, 2007

(51) Int. Cl.
*G11C 5/06* (2006.01)
(52) U.S. Cl. .......................................... 365/63; 365/72
(58) Field of Classification Search ................ 365/63
See application file for complete search history.

(56) References Cited

U.S. PATENT DOCUMENTS

| | | | |
|---|---|---|---|
| 5,818,748 A | 10/1998 | Bertin et al. | |
| 6,291,858 B1 | 9/2001 | Ma et al. | |
| 6,477,077 B1 * | 11/2002 | Okazawa | 365/145 |
| 6,738,279 B1 * | 5/2004 | Kablanian | 365/72 |
| 2004/0057276 A1 * | 3/2004 | Nejad et al. | 365/158 |
| 2004/0124466 A1 * | 7/2004 | Walker et al. | 257/344 |

* cited by examiner

*Primary Examiner*—Son L Mai
(74) *Attorney, Agent, or Firm*—Robert R. Williams

(57) ABSTRACT

A semiconductor storage array has a first array portion on a first plane of circuitry and a second array portion on a second plane of circuitry. A composite bit line and/or a composite word line is divided and arranged to have a first portion on the first array portion and a second portion on the second array portion. The two portions of the composite word line or the composite bit line are on different planes of circuitry, and three-dimensional interconnections connect proximal ends of the word line portions, or proximal ends of the bit line portions. A word line driver drives the word line portions in parallel. A bit line driver drives the bit line portions in parallel. Signal propagation times down the composite word or bit lines are significantly less than signal propagation times down corresponding undivided word or bit lines.

18 Claims, 10 Drawing Sheets

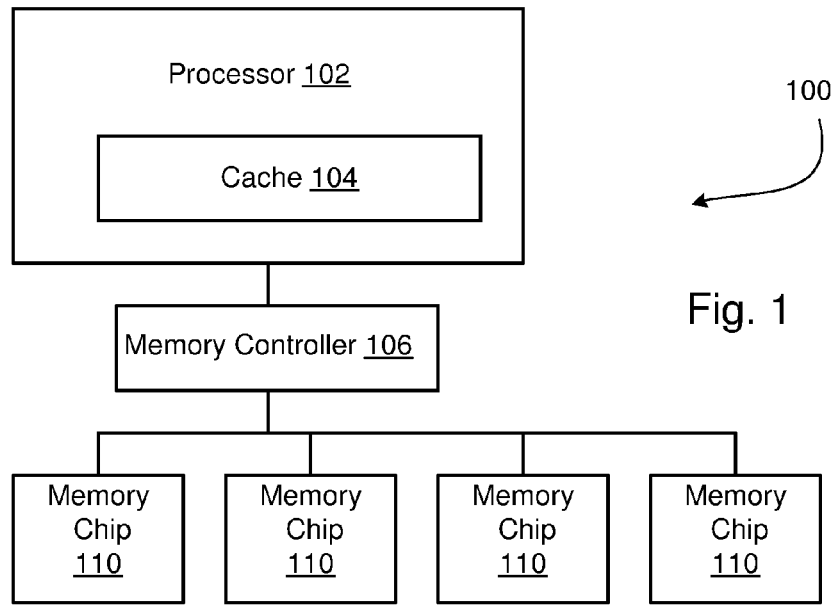
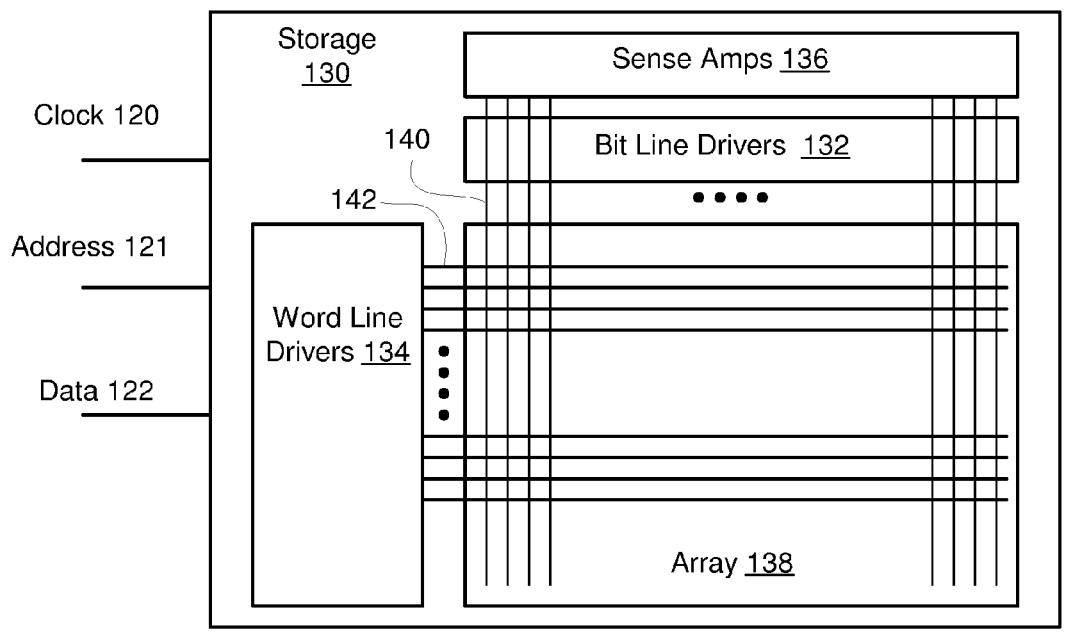

ARRAY SPLIT ACROSS THREE-DIMENSIONAL INTERCONNECTED CHIPS

BACKGROUND OF THE INVENTION

1. Field of the Invention

This invention relates generally to arrays on semiconductor chips. More particularly this invention relates to improvement in performance of arrays in semiconductor chips in three-dimensional configurations.

2. Description of the Related Art

Modern electronic systems typically use at least one type of semiconductor storage to hold data or program instructions used to produce useful results.

For example, Dynamic Random Access Memory (DRAM) is a dense and relatively fast storage apparatus. Typically, information is stored as presence or absence of electrical charge on capacitors in storage cells in a storage array in the DRAM. Addresses (and suitable control signals) are driven to the DRAM, and, for reads, data is read from selected storage cells in the DRAM. DRAMs are sometimes embedded in semiconductor chips further comprising processor cores, memory controllers, and the like. For example, a modern processor chip may comprise one or more processor cores, a level-1 cache, a level-2 cache, and a level-3 cache. One or more of the caches may be implemented as DRAMs.

Another commonly used storage apparatus is a Static Random Access Memory (SRAM). An SRAM constructed in the same technology generation of silicon products as a DRAM is typically considerably faster (that is, has faster read accesses and write times) but is significantly larger than a DRAM per bit of storage. A DRAM storage cell typically comprises a switch device (usually a Field Effect Transistor (FET)) and a capacitor device (usually a thin dielectric with an electrode on each side). An SRAM storage cell typically comprises six or eight FETs.

In either a DRAM storage or an SRAM storage, an address is decoded and a word line is activated. The word line is typically relatively long and electrically resistive. The storage cells, as well as parasitic capacitances on the word line itself, causes the word line to appear as a distributed "RC" interconnection, which is well characterized with a number of series resistors with capacitors to ground between each pair of resistors. A word line driver drives a signal at a proximal end of the word line and the signal propagates along the word line. A significant part of a read access time or a write time is devoted to propagating the signal from the proximal end of the word line to a distal end of the word line. Similarly, bit line drivers drive data to be written at a proximal end of a bit line. That data must propagate to a distal end of the bit line, also extending write times. During reads, storage cells in the storage array must drive a read data signal onto the bit line, and this read data signal must propagate at least a portion of the bit line to a sense amplifier.

Modern electronic systems increasingly demand fast read access times and fast write times in semiconductor storage.

Therefore, there is a need for a method and apparatus for reducing read access times and write times in a semiconductor storage.

SUMMARY OF THE INVENTION

The present invention provides methods and apparatus for improving performance of semiconductor storage by splitting an array into one or more array portions on a first plane of circuitry and one or more array portions on a second plane of circuitry, the first and second planes of circuitry being parallel and not coplanar. three-dimensional interconnects are used to connect proximal ends of word line portions on array portions on the first plane of circuitry to corresponding proximal ends of word line portions on array portions on the second plane of circuitry. Since signal propagation along distributed RC (resistor & capacitor) conductors varies approximately as the square of the length of the distributed RC conductors, making a composite word line by dividing a word line in two and driving the two word line portions in parallel cuts the signal propagation time in the composite word line by approximately a factor of four.

Similarly, bit lines, in embodiments of the invention are also divided into bit line portions, the bit line portions connected by three-dimensional interconnect and driven in parallel.

BRIEF DESCRIPTION OF THE DRAWINGS

FIG. 1 shows a block diagram of a computer system.

FIG. 2 shows a block diagram of a semiconductor storage used by the computer system of FIG. 1.

DETAILED DESCRIPTION OF THE PREFERRED EMBODIMENTS

Figure 3:
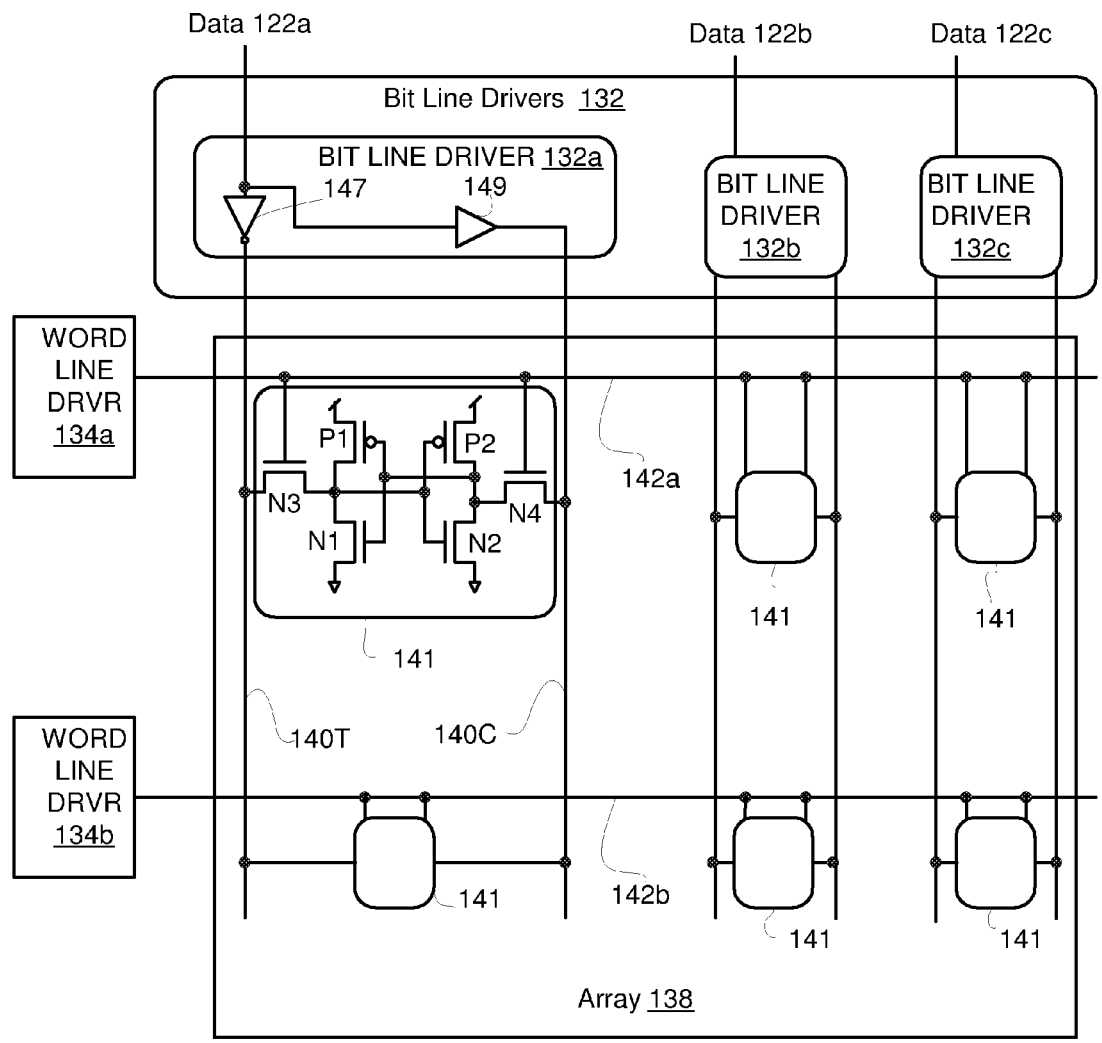
FIG. 3 shows additional detail of an SRAM semiconductor storage.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides method and apparatus to speed read and write access times to a semiconductor storage by reducing word line signal propagation times from a proximal end of a word line to a distal end of the word line and/or by reducing bit line signal propagation times from a proximal end of a bit line to a distal end of the bit line. During reads of a particular storage cell in a semiconductor storage, the particular storage cell drives a voltage onto a bit line. Instances of storage cells are distributed between the proximal end and the distal end of the bit line. In a worst case (for propagation delay), the particular storage cell may be at or near the distal end of the bit line.

Having reference now to the drawings, and, in particular to FIG. 1, a computer system 100 is shown, comprising a processor 102. The processor is depicted as having a semiconductor storage embodied as cache 104. Cache 104 may be an SRAM (Static Random Access Memory) or a DRAM (Dynamic Random Access Memory). It will be understood that modern processors typically contain multiple levels of cache.

Processor 102 is coupled to a memory controller 106. Memory controller 106 receives read requests for data (data includes program instructions in a higher level storage) and write requests to write data sent from processor 102 to the higher level storage. The higher level storage comprises one or more memory chips 110. It is understood that additional buffer chips may be placed between memory controller 106 and a memory chip 110. For example, in some higher level storage systems, a number of memory chips 110 are placed on a DIMM (Dual In-Line Memory Module) along with a buffer chip. The buffer chip receives data and addresses from memory controller 106 and the buffer chip then accesses (reads and writes) to the memory chips 110 placed on the DIMM.

FIG. 2 shows a block diagram of a semiconductor storage 130 as used in cache 104 and/or memory chips 110. Semiconductor storage 130 is coupled to one or more data signals 122, one or more address signals 121 and one or more clock signals 120. Data signals 122, address signals 121 and clock signals 120, depending on where a particular semiconductor storage 130 is used, are coupled to well-known circuitry in processor 102 in the case of semiconductor storage 130 used in cache 104. In the case of semiconductor storage 130 used in memory chips 110, clock signals 120, address signals 121, and data signals 122 are coupled to well-known circuitry in memory controller 106, or, as explained above, an instance of semiconductor storage 130 used in memory chips 110 is coupled to well-known circuitry in a buffer chip (not shown) on a DIMM (not shown) upon which memory chips 130 are attached).

Semiconductor storage 130 further comprises word line drivers 134, which decode at least a portion of the signals received on address signals 121 and activate one word line 142 responsive to the decode. Bit line drivers 132 activate one or more bits lines 140 during writes of data received on data signals 122. Sense amps 136 read data placed on bit lines 140 during reads, the read data coming from storage cells in a semiconductor array 138.

FIG. 3 shows portions of an SRAM embodiment of semiconductor storage 130 in more detail. Word line drivers 134a and 134b respectively drive word lines 142a and 142b. Typically, semiconductor storage 130 may have hundreds, or even thousands of word lines. Bit line drivers 132 comprise a plurality of circuits that drive bit lines. Bit line driver 132a is simplistically shown to further comprise inverter 147 and buffer 149. Inverter 147 receives data signal 122a (a signal from data signals 122, shown in FIG. 2) and drives bit line 140T ("true" phase of a bit line pair; SRAM embodiments of semiconductor storage 130 typically need both "true" and "complement" phase bit lines). Buffer 149 drives bit line 140C ("complement" phase) with a phase opposite that driven onto bit line 140T.

Bit line drivers 132b and 132c similarly receive data signals 122b and 122c and drive their respective bit lines.

Storage cell 141 (one instance expanded) in an SRAM embodiment as shown in FIG. 3, typically contains a cross coupled pair of inverters to store a logical "1" or "0" in storage cell 141. As shown, P1, a P-channel field effect transistor (PFET) and N1, an N-channel field effect transistor (NFET) make up one of the cross coupled pair of inverters. P2 and N2 make up the other inverter of the cross coupled pair of inverters. When word line 142a is activated, N3 and N4 conduct; during writes, data driven on bit lines 140T and 140C are passed through N3 and N4, setting the cross coupled inverters to the desired "1" or "0" of the write. During reads, word line 142a is activated, and the cross coupled inverters pass their voltage values through N3 and N4 onto bit lines 140T and 140C to be read by sense amps 136 (shown in FIG. 2). During reads, inverter 147 and buffer 149 are inhibited (circuitry not shown) from actively driving bit lines 140T and 140C.

Array 138 of semiconductor storage 130 may have hundreds or even thousands of storage cells 141 connected to each word line 142. Array 138 may have hundreds or even thousands of storage cells 141 connected to each bit line 140.

Figure 4A:
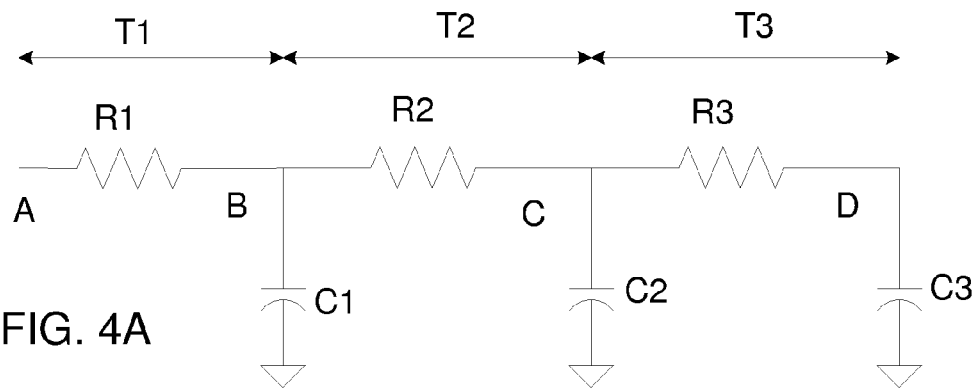
FIG. 4A shows a schematic of a distributed RC conductor.
Figure 4B:
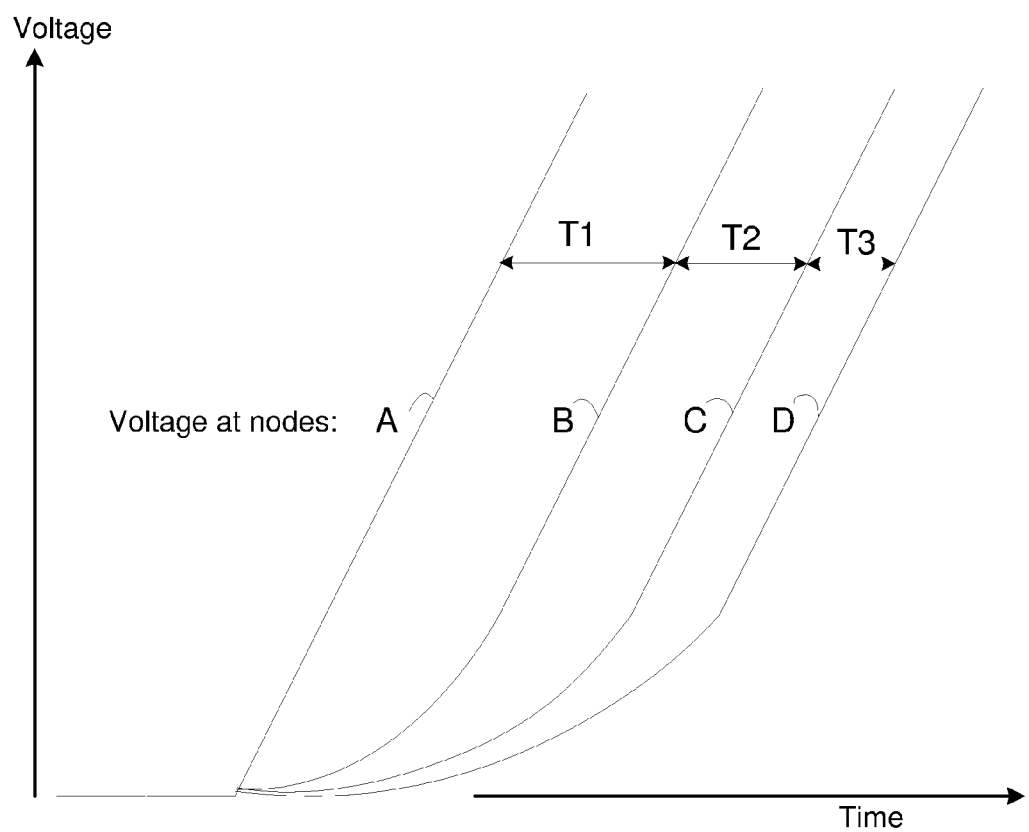
FIG. 4B shows voltages at nodes in the distributed RC conductor shown schematically in FIG. 4A.

Referring now to FIGS. 4A and 4B, a circuit schematic representative of a distributed RC conductor is shown in FIG. 4A. Node A is a proximal end of the distributed RC conductor and in FIG. 4A is the input where a signal is driven (e.g., by a word line driver 134 in the case of a word line, or by a bit line driver 132 in the case of a bit line). R1, R2, and R3 represent the distributed resistance of portions of the distributed RC conductor. C1, C2, and C3 represent distributed parasitic capacitance along the distributed RC conductor, plus any regular periodic loading of storage cells connected to the distributed RC conductor.

In the simplified waveform drawing of FIG. 4B, node A is driven by a voltage source (not shown) that ramps a voltage on node A at a continuous rate (dV/dt). After some transients, node B will follow at the same slope (dV/dt). After further transients, node C and node D will follow at the same slope. A value of T1 in FIG. 4B, after transients have disappeared, is R1*(C1+C2+C3). T2=R2*(C2+C3). T3=R3*C3. Of course, in a real circuit, a driver will usually drive with a relatively high dV/dt at node A, and will stop rising shortly thereafter when the driver's output reaches a supply voltage (e.g., Vdd for rising signals; Gnd for falling signals). Nevertheless, longer distributed RC conductor will have a significantly longer signal propagation time than a shorter distributed RC conductor.

A reasonable approximation of signal propagation times from a proximal end to a distal end of a distributed RC conductor is that, if a length of the distributed RC conductor doubles, the signal propagation time increases by a factor of four. A simulation of a representative word line of 1.0 mm with a representative driver versus a 0.5 mm word line in the same technology (that is, same conductor width and parasitic couplings and same storage cell loadings) showed a signal propagation ratio of 3.6 to 1.

Reduction of propagation delay can therefore be achieved by shortening a length of a distributed RC conductor. For example, if a distributed RC conductor of length "L" is divided into two parts, each part being "L/2", and the two parts being driven in parallel, significant improvements in propagation delay is achieved. However, on a single plane of circuitry, dividing a word line or a bit line is often undesirable. For example, array 138 can be divided into two portions on the single plane of circuitry, with word line drivers 134 placed between the two portions of array 138. This arrangement requires that address signals 121 (FIG. 2) and data signals 122 (FIG. 2) be routed further on the single plane of circuitry, being routed over or around one of the two portions of array 138 to get to word line drivers 134. The additional delay caused by the further routing of address signals 121 and/or data signals 122 reduces the timing advantages accrued by partitioning array 138.

Recent developments in semiconductor technology provides for three-dimensional chip designs. For example, in U.S. Pat. No. 5,818,748 "Chip Function Separation Onto Separate Stacked Chips", Bertin, et al, interconnection of circuitry on several chips interconnected in the "Z" dimension is described (i.e., on vertically stacked chips). Ma, et al, in U.S. Pat. No. 6,291,858, "Multistack 3-Dimensional High Density Semiconductor Device and Method for Fabrication" teaches of other methods of three-dimensional interconnection of planes of circuitry.

Figure 5A:
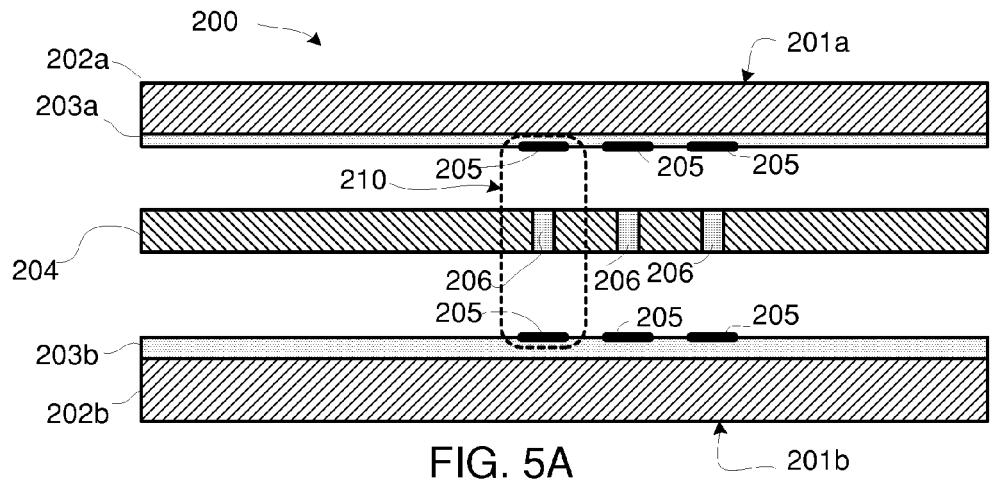
FIGS. 5A-5D show various implementations of three dimensional interconnect of semiconductor device areas.
Figure 5B:
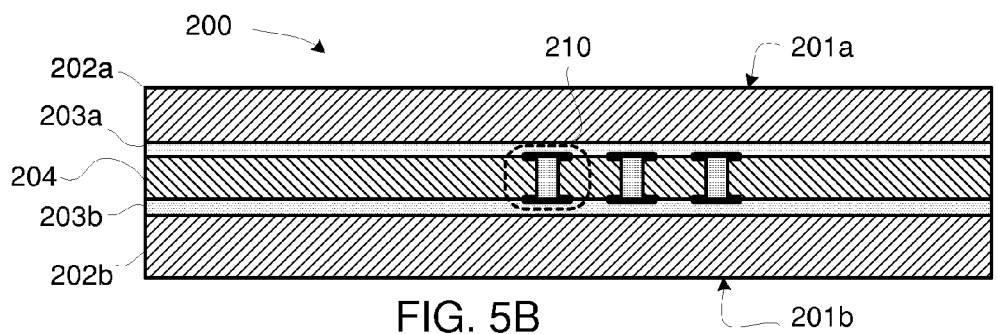

FIGS. 5A and 5B show a first example of three-dimensional interconnected stacked circuitry 200. A first chip 201a has a first semiconductor substrate 202a and a first plane of circuitry 203a, the first plane of circuitry 203a having circuits formed thereon. A second chip 201b has a second semiconductor substrate 202b and a second plane of circuitry 203b having circuits formed thereon. An insulator 204 further comprising one or more vias 206 is placed between first chip 201a and the second chip 201b. First chip 201a and second chip 201b further comprise contacts 205 suitable for making electrical connection to vias 206. Interconnections 210 (one referenced) comprise contacts 205 and vias 206. FIG. 5A shows an exploded view; FIG. 5B shows first chip 201a and second chip 201b joined together with interconnections completed between circuitry on first plane of circuitry 203a and second plane of circuitry 203b.

Figure 5C:
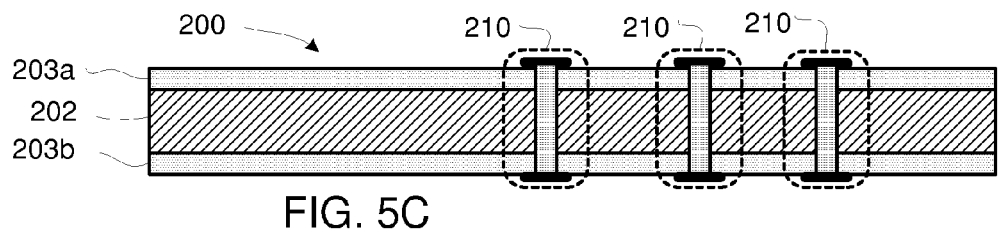

FIG. 5C shows a second exemplary three-dimensional interconnected stacked circuitry 200. In FIG. 5c, semiconductor substrate 202 has a first plane of circuitry 203a on a first surface of semiconductor substrate 202 and a second plane of circuitry 203b on a second surface of semiconductor substrate 202, the second surface of semiconductor substrate 202 being opposite the first surface of semiconductor substrate 202. Vias are shown through semiconductor substrate 202 to contacts on both the first plane of circuitry 203a and the second plane of circuitry 203b, thus interconnecting circuitry on the first plane of circuitry 203a and the second plane of circuitry 203b.

Figure 5D:
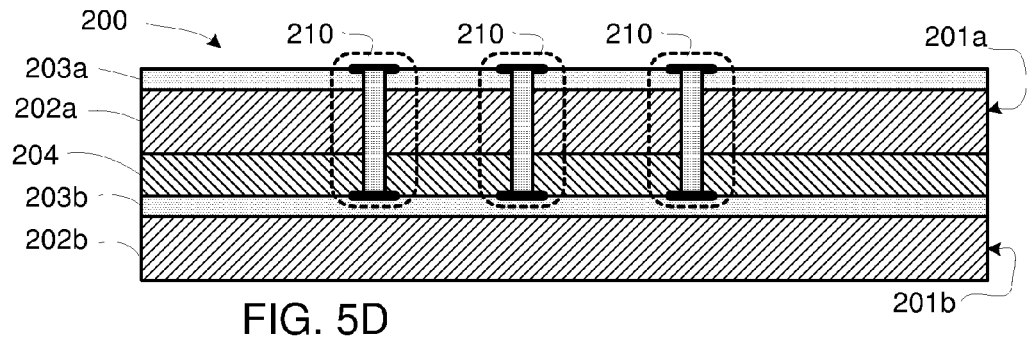

FIG. 5D shows a third exemplary three-dimensional interconnected stacked circuitry 200. In FIG. 5D, both the first plane of circuitry 203a and second plane of circuitry 203b are on "top" (as seen in the side view) of their respective semiconductor substrates 202a and 202b. An insulator 204 separates first chip 201a and second chip 201b. As depicted, interconnections 210 pass through insulator 204 and the substrate 202a of first chip 201a, interconnecting circuitry on first plane of circuitry 203a and circuitry on second plane of circuitry 203b.

Figure 6:
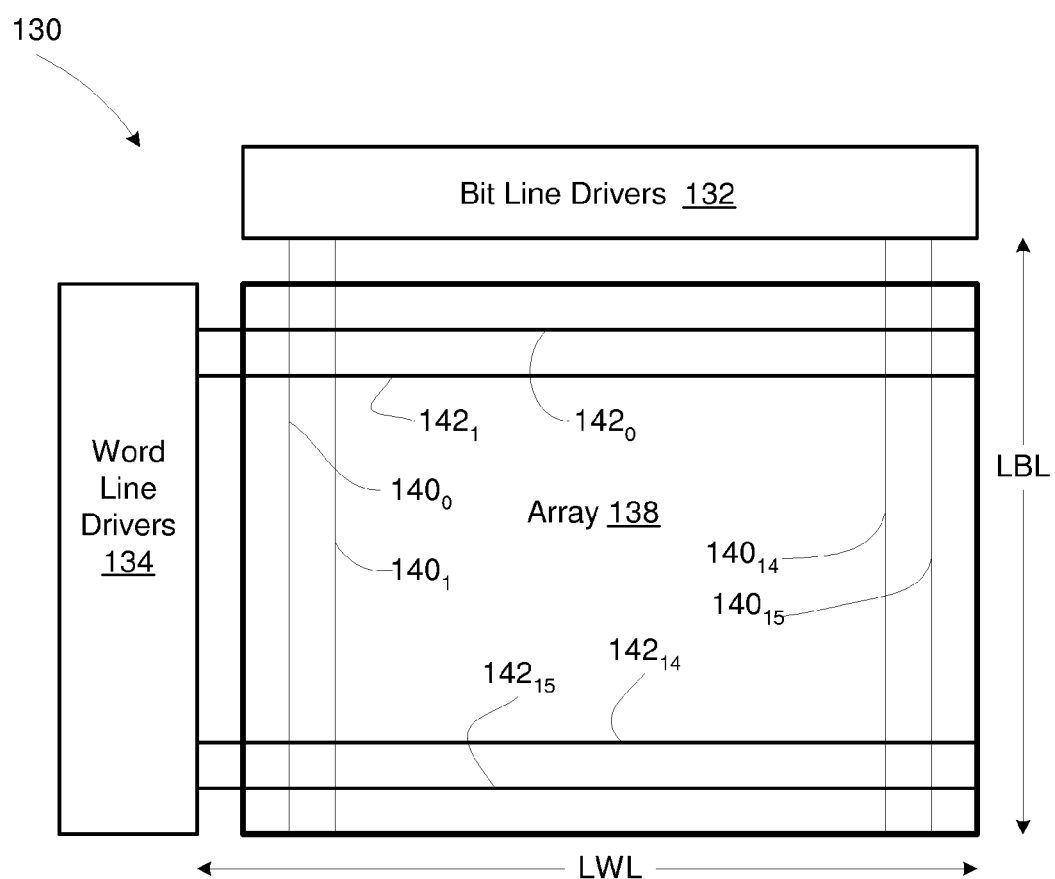
FIG. 6 shows a particular semiconductor storage having an array with word lines and bit lines reference numbered for later reference.

FIG. 6 shows portions of an exemplary semiconductor storage 130 for later reference. Array 138 in FIG. 6 is shown to have sixteen word lines, referenced as word line $142_0$ through word line $142_{15}$. Length of all word lines in FIG. 6 is "LWL" (Length of Word Line). Similarly Array 138 in FIG. 6 is shown to have sixteen bit lines, referenced as bit lines $140_0$ through bit line $140_{15}$. Length of all bit lines in FIG. 6 is "LBL" (Length of Bit Line).

Figure 7:
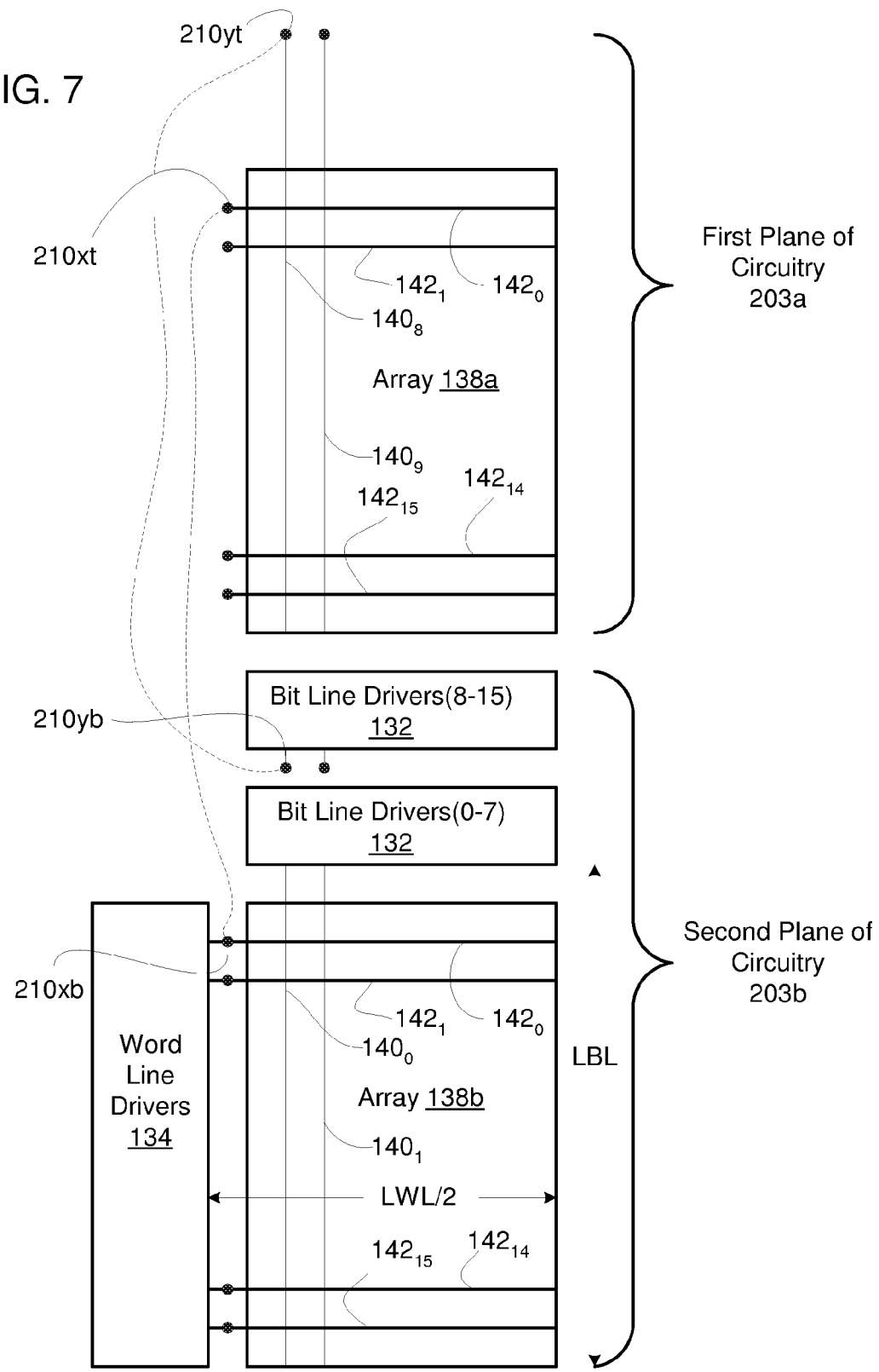
FIG. 7 shows the semiconductor storage of FIG. 6 with the array partitioned into a first array portion in a first plane of circuitry and a second array portion in a second plane of circuitry, the second plane of circuitry being parallel to and not coplanar with the first plane of circuitry.

FIG. 7 shows portions of the exemplary semiconductor storage 130 of FIG. 6, wherein array 138 is partitioned, having a first array portion 138a on a first plane of circuitry (such as, for example, any of the embodiments of first plane of circuitry 203a shown in FIGS. 5A-5D). FIG. 7 shows a second array portion 138b on a second plane of circuitry (such as, for example, any of the embodiments of second plane of circuitry 203b shown in FIGS. 5A-5D).

FIG. 7 shows first plane of circuitry 203a having array portion 138a. Second plane of circuitry 203b comprises array 138b, word line drivers 134, and bit line drivers 132 (shown as bit line drivers (0-7) and bit line drivers (8-15)). Thus, array 138 is divided into two portions, array 138a and array 138b. Each word line signal needs to propagate only along a physical RC conductor of length LWL/2, as shown. Note that, for example, word line $142_0$ is embodied half in array 138a and half in array 138b, the two halves of word line $142_0$ together forming a composite word line $140_0$ equivalent to the undivided word line $142_0$ of FIG. 6. An interconnect 210 connects a proximal end of the portion of word line $142_0$ in array portion 138a and a proximal end of the word line portion $142_0$ in array portion 138b, the interconnection 210 being at or near the particular word line driver in word line drivers 134 that drives word line $142_0$. The interconnect 210 that interconnects the portion of word line $142_0$ on array 138a to the portion of word line $142_0$ on array 138b is shown as interconnect 210xt on the first plane of circuitry 203a and interconnect 210xb on second plane of circuitry 203b. Interconnects 210xt and 210xb are simply top and bottom of the same interconnect 210. A dotted line further indicates the interconnection of the two word line portions making up a composite word line $142_0$.

In FIG. 7, all of the elements shown in first plane of circuitry 203a are physically directly over the corresponding elements in second plane of circuitry 203b. That is, all interconnects 201 (shown by solid circles in FIG. 7, not all referenced) on first plane of circuitry 203a are simply tops of corresponding interconnects 201 (shown by solid circles in FIG. 7, not all referenced) on second plane of circuitry 203b. Array 138a is physically directly above array 138b.

In FIG. 7, bit line length, LBL, is unchanged from the bit line length of FIG. 6. In FIG. 7, bit line drivers (0-7) drive bit line $140_0$ through bit line $140_7$ in array portion 138b (for simplicity, only bit lines $140_0$ and $140_1$ are shown). Bit line drivers (8-15) are driven through interconnections 210 to drive bit lines $140_8$ through $140_{15}$ in array portion 138a (for simplicity, only bit lines $140_8$ and $140_9$ are shown). The particular interconnection 210 used to drive bit line $140_8$ in array 138a is further illustrated with a dotted line; the top of that particular interconnection 210 is designated 210yt and the bottom of that particular interconnection 210 is designated 210yb.

It will be understood that the total capacitance driven on any particular composite word line 142 that is divided into two portions, the two portions being driven in parallel, as shown in FIG. 7 is essentially the same as the total capacitance driven on the corresponding word line 142 that is undivided as shown in FIG. 6. In fact, the interconnection 210 required for the three-dimensional interconnection increases the total capacitance slightly by a small parasitic capacitance associated with the interconnection 210. However, since each word line portion of a composite word line 142 in FIG. 7 (e.g., word line $142_0$ on array portion 138b) is half the total length of the corresponding word line 142 in FIG. 6, propagation time of a signal driven by a particular word line driver 134 from a proximal end of a particular word line portion 142 to a distal end of the particular word line 142 in FIG. 7 is approximately 0.25 times the propagation time of a signal driven by a particular word line driver 134 from a proximal end to a distal end of a particular word line 142 in FIG. 6, as described earlier in reference to FIGS. 4A and 4B with regards to signal propagation along a distributed RC conductor.

As shown in FIG. 7, array portion 138a and array portion 138b have the same number of word lines 142 and bit lines 140. Since each word line is physically divided into a first word line portion on array portion 138a and a second word line portion on array portion 138b, array portion 138a and array portion 138b both have the same number of word line portions. However, since any particular bit line 140 of FIG. 7 is limited to either array portion 138a or array portion 138b, array portions 138a and 138b may be configured to have different numbers of bit lines.

Figure 8:
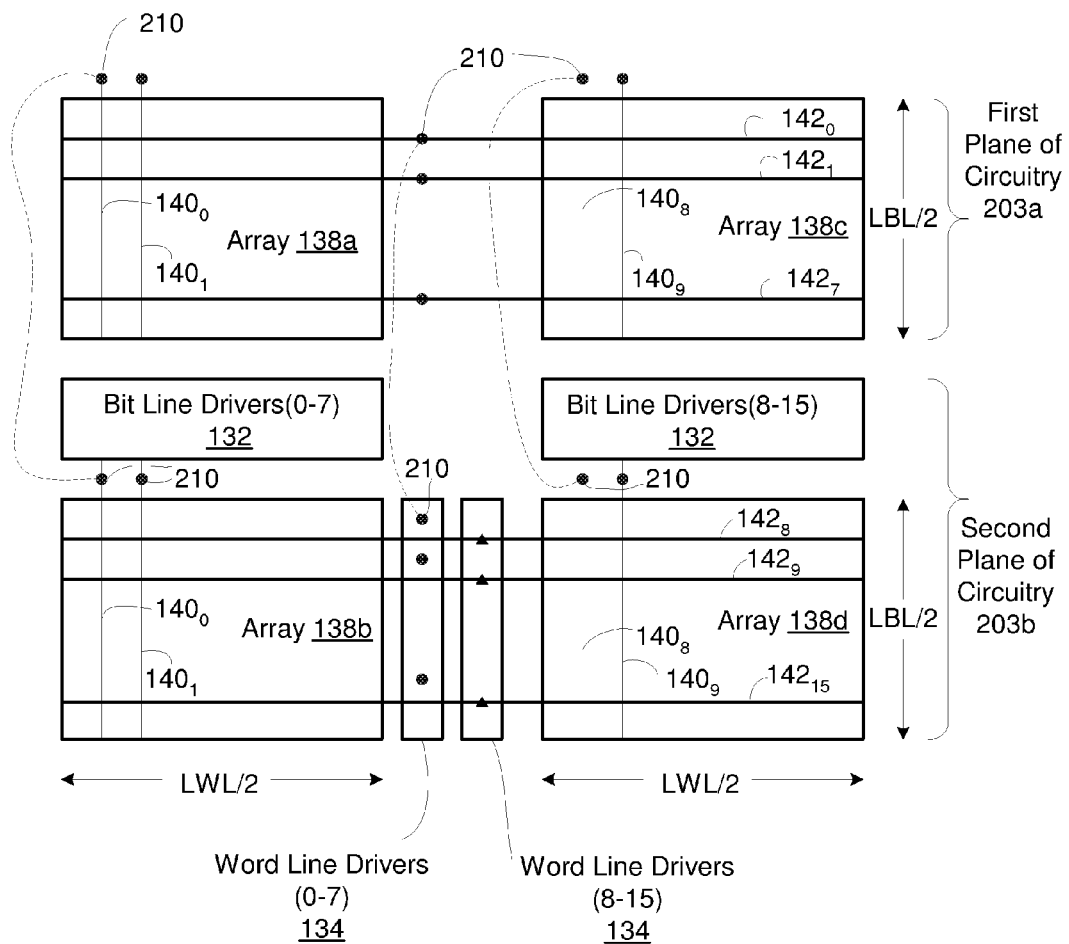
FIG. 8 shows the semiconductor storage of FIG. 6 partitioned into four array portions.

FIG. 8 illustrates another embodiment of splitting array 138 to reduce propagation delay times along both word lines 142 and bit lines 140.

In FIG. 8, array portions 138a and 138c are physically placed on first plane of circuitry 203a. Array portions 138b and 138d; bit line drivers (0-7 and 8-15) 132; and word line drivers (0-7 and 8-15) 134 are placed on second plane of circuitry 203b. Physically, array portion 138a is directly above array portion 138b and array portion 138c is directly above array portion 138d. Interconnections 210 are three-dimensional interconnections between first plane of circuitry 203a and second plane of circuitry 203b. Several three-dimensional interconnections provided by interconnections 210 are illustrated using dotted lines to ensure clarity in explanation of the interconnections. For simplicity, not all interconnections 210 are reference numeraled. In FIG. 8, all solid black circles are interconnections 210.

In FIG. 8, two word line portions together make up a coplanar composite word line equivalent to a particular word line in FIG. 6. A coplanar composite word line has both the first and the second word line portions on the same plane of circuitry. It will be seen in FIG. 8 that word line portion lengths through which a signal must propagate from a proximal end to a distal end of the word line portions are half as long as the word line length (LWL) seen in FIG. 6. Three interconnections 210 in FIG. 8 are further illustrated with dotted lines for clarity. One is an interconnect between word line driver (0) in word line drivers (0-7) 134 which drives coplanar composite word line $142_0$. A second is an interconnect of bit line driver (0) in bit line drivers (0-7) 132 which drives composite bit line $140_0$; and a third is an interconnect between bit line driver (8) in bit line drivers (8-15) 132, which drives composite bit line $140_8$. Each word line driver in word line drivers (0-7) drives a corresponding composite word line 142 on first plane of circuitry 203a. Word line drivers in word line drivers (8-15) drive word lines $142_8$ through $142_{15}$, which are not connected to an interconnect 210 as these word lines exist only on second plane of circuitry 203b. For clarity, connections between word line drivers (8-15) 134 and word lines $142_8$ through $142_{15}$ are shown as filled in triangles. These connections are normal connections between circuitry and conductors on second plane of circuitry 203b.

As explained above, propagation of a signal through a distributed RC conductor varies (approximately) as the square of the length of the distributed RC conductor. Therefore, propagation delays associated with the composite word lines (i.e., half length word line portions driven in parallel) shown in FIG. 8 will be approximately one fourth the propagation delays associated with the full length (i.e., LWL) word lines shown in FIG. 6. Stated another way, signal propagation in any composite word line is approximately one fourth that of the corresponding word line in FIG. 6.

Referring now to bit lines 140 in FIG. 8, composite bit lines are created in a manner similar to the composite word lines described above. A composite bit line has a first bit line portion in a first array portion and a second bit line portion in second array portion; the two bit line portions are driven in parallel, using an interconnect 210. As before, the first array portion is on a first plane of circuitry and the second array portion is on a second plane of circuitry, the first and second planes of circuitry being parallel but not coplanar. For example, half of composite bit line $140_0$ is in array 138a and a second half of composite bit line $140_0$ is in array 138b, connected together using an instance of interconnect 210 (shown with a dotted line). Similarly, bit line $140_8$ has a first portion on array 138c on first plane of circuitry 203a and a second portion on array 138d on second plane of circuitry 203b. The first and second portions of bit line $140_8$ are connected with an instance of interconnect 210, and is further identified with a dotted line. Bit line $140_8$ is driven by a bit line driver in bit line drivers (8-15) 132.

It will be seen that, in each composite bit line, bit line portion lengths through which a signal must propagate from a proximal end to a distal end in FIG. 8 are half as long as bit line lengths shown in FIG. 6; therefore signal propagation times in bit line portions are approximately one fourth as long as the corresponding undivided bit line of FIG. 6 (a simulation shows that the corresponding bit line of FIG. 6 has a signal propagation time 3.6 times longer than the corresponding composite bit line shown in FIG. 8).

It is recognized that, in FIG. 8, word line drivers are placed "between" array portion 138b and array portion 138d. As explained earlier, such placement requires routing address signal conductors further, which will reduce improvements in total delays on the word line paths, starting from address availability, as described earlier. Bit line drivers 132 (i.e., bit line drivers (0-7) and bit line drivers (8-15)) are not placed between array portions, so that routing of signals to bit line drivers 132 is not different from the layout shown in FIG. 6. Signal propagation from a proximal end of a particular bit line portion 140 to a distal end of the bit line portion 140 will be approximately four times faster in the configuration shown in FIG. 8 versus the undivided bit line configuration shown in FIG. 6, since each bit line portion 140 shown in FIG. 8 is one half as long (in terms of distributed RC conductor) as the corresponding undivided bit line 140 shown in FIG. 6.

Figure 11:
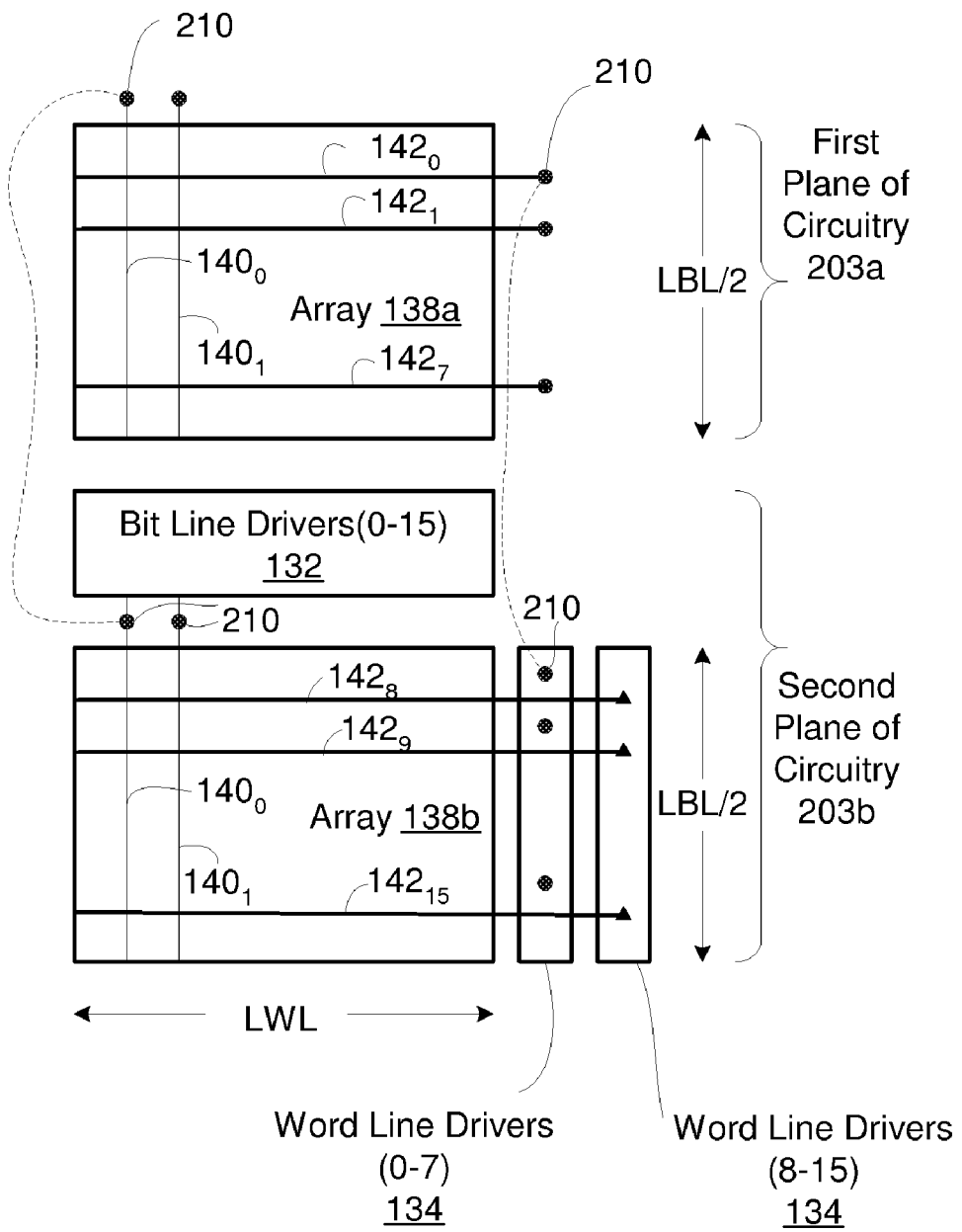
FIG. 11 shows a storage array similar to that shown in FIG. 8, with full length word lines.

FIG. 11 shows portions of semiconductor storage 130 similar to that shown in FIG. 8, except that all word lines 142 are undivided (that is, a signal driven from a proximal end must propagate serially through the entire word line length (LWL). Bit lines 140, however, are composite bit lines, each bit line 140 being split into two bit line portions and the two bit line portions are driven in parallel as explained in reference to FIG. 8. The embodiment of FIG. 11 is advantageous when there are many word lines 142 but relatively few bit lines 140. It is noted that the entire set of word lines 142 is partitioned between a first subset of word lines in array 138a on the first plane of circuitry 203a, and a second subset of word lines in array 138b on the second plane of circuitry 203b. While an equal partitioning of word lines is shown (that is, word line drivers 0-7 drive word lines $142_0$ through $142_7$ and word line drivers 8-15 drive word lines $142_8$ through $142_{15}$) there is no requirement in either the embodiment of FIG. 8 or the embodiment of FIG. 11 that an equal number of word lines 142 be in the first subset of word lines and in the second subset of word lines.

As in FIG. 8, interconnects 210 in FIG. 11 connect corresponding word line drivers (0-7) 134 to word lines 142 ($142_0$-$142_7$) on first plane of circuitry 203a; each interconnect 210 represented by a solid circle. Connections between word line drivers (8-15) 134 to corresponding word lines 142 ($142_8$-$142_{15}$). A first dotted line is shown to illustrate a first instance of interconnect 210 connecting proximal ends of bit line $140_0$. A second dotted line is shown to illustrate a second instance of an interconnect 210 connecting a word line driver to word line $142_0$.

Figure 9:
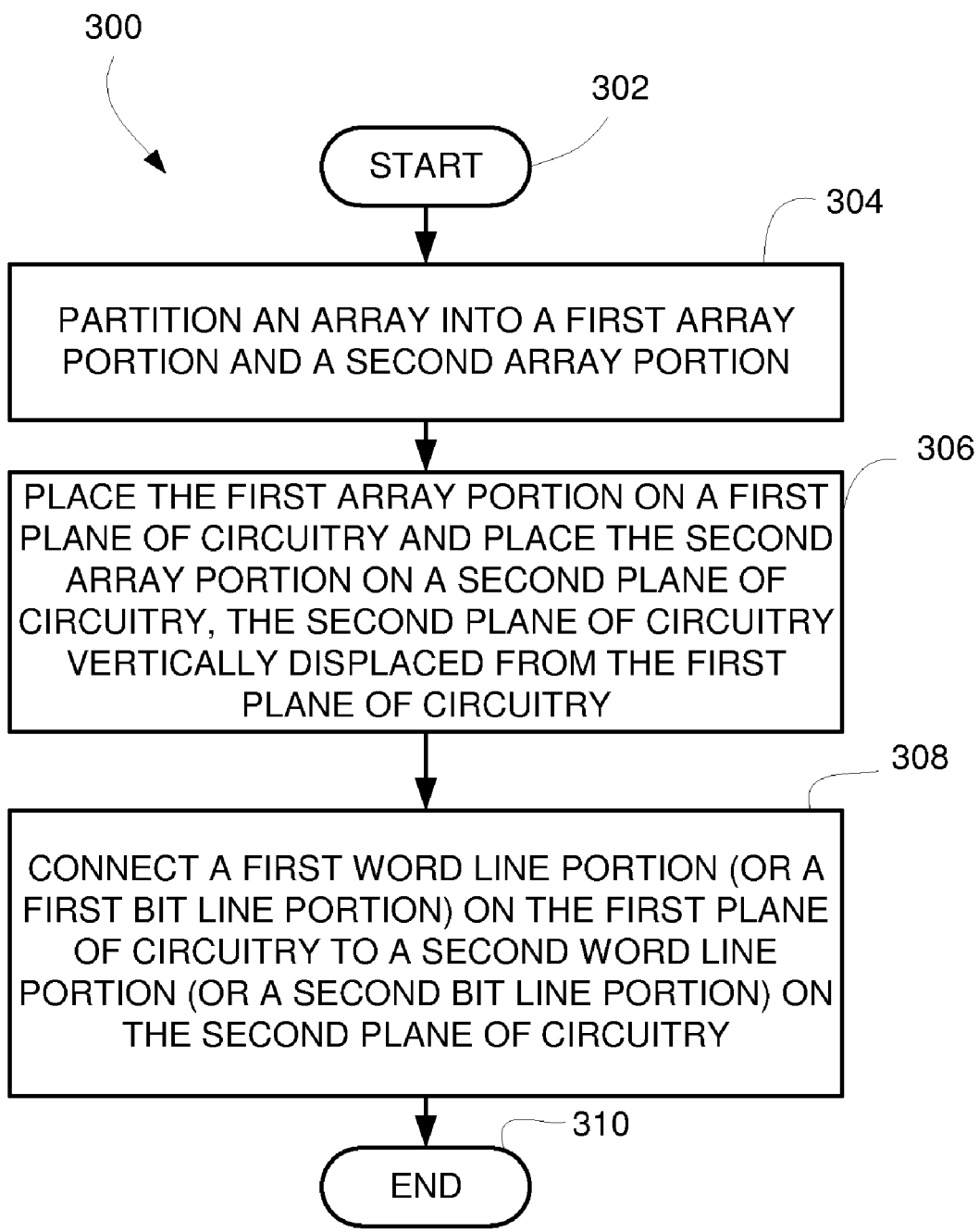
FIG. 9 shows a flow chart of a method embodiment of the invention.

FIG. 9 illustrates a method 300 that corresponds to the array partitioning and interconnection seen in FIG. 7. Method 300 begins at step 302.

In step 304 an array further comprising storage cells such as SRAM storage cell 141 shown in FIG. 3 or DRAM storage cells 141 (not shown) is partitioned into a first array portion (such as array portion 138b shown in FIG. 7) and a second array portion (such as array portion 138a shown in FIG. 7). The first array portion and the second array portion each have a portion of each word line in the array. The two word line portions together making up a composite word line, equivalent to the same word line in an undivided array. In another embodiment, a similar creation of composite bit lines are created; a first bit line portion created in the first array portion and a second bit line portion is created in the second array portion.

In step 306 the first array portion is placed on a first plane of circuitry and the second array portion is placed on a second plane of circuitry. The first plane of circuitry and the second plane of circuitry are configured to be parallel and not coplanar.

In step 308, an interconnect is configured to connect a proximal end of a word line portion of a particular word line on the first array portion to a proximal end of a word line portion of the particular word line on the second array portion. The two word line portions are then configured to be driven in parallel by a word line driver connected to the interconnect. In another embodiment, having composite bit lines, proximal ends of corresponding bit line portions are connected by interconnects, the bit line portions thus configured to be driven in parallel by a bit line driver connected to the interconnect. Step 310 ends method 300.

Figure 10:
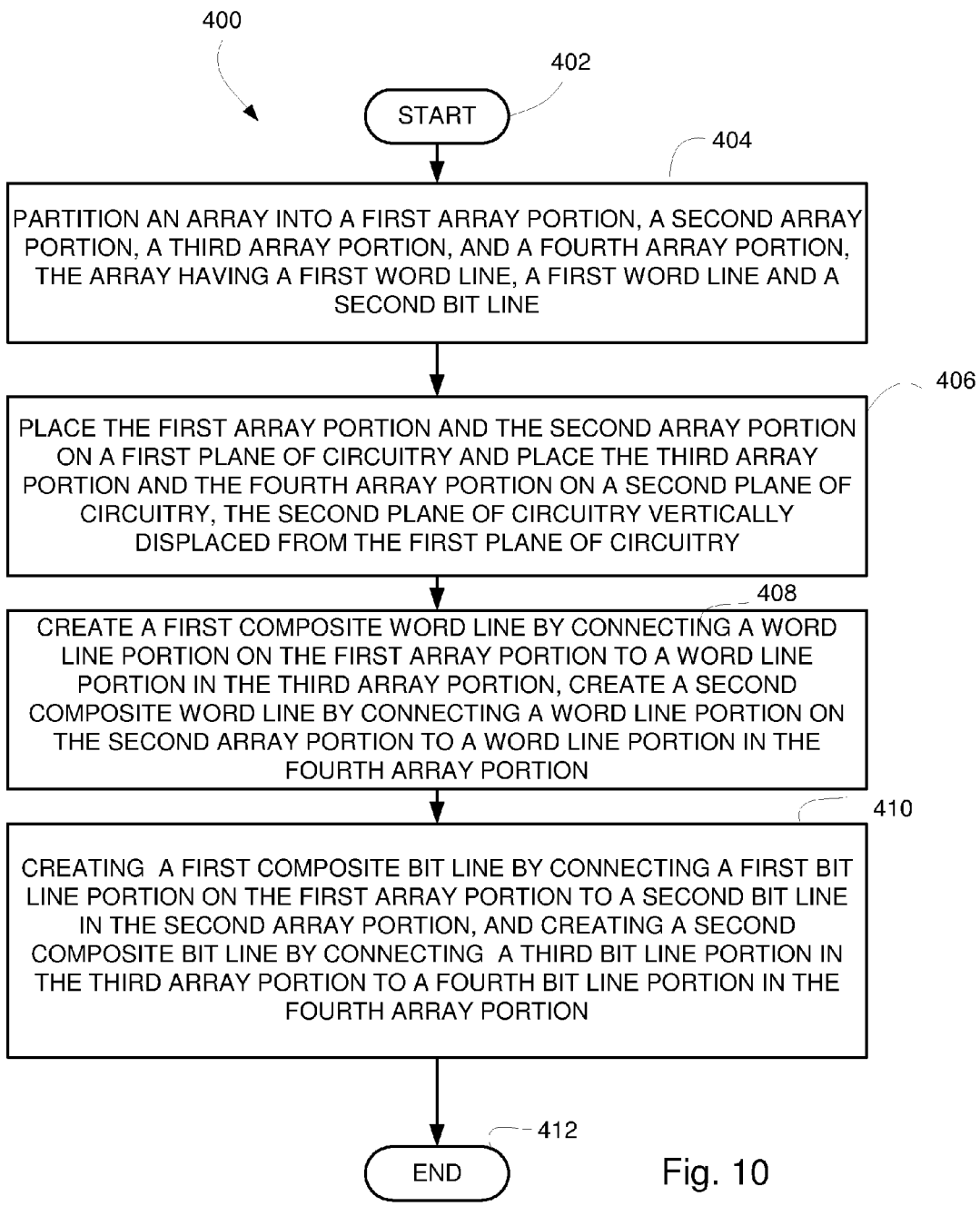
FIG. 10 shows a flow chart of a second method embodiment of the invention.

FIG. 10 shows a method 400 embodiment of the apparatus shown in FIG. 8 and described in words earlier with reference to FIG. 8. Method 400 begins at step 402.

In step 404, an array, such as array 138, shown in FIG. 6, is partitioned into four array portions, as shown in FIG. 8 (Array portions 138a, 138b, 138c, and 138d). The array has at least two word lines and at least two bit lines.

In step 406, a first and third array portion (array portions 138a and 138c as shown in FIG. 8) are placed on a first plane of circuitry, such as plane of circuitry 203a (FIGS. 5A-5D). A second and fourth array portion (array portions 138b and 138d as shown in FIG. 8) are placed on a second plane of circuitry, such as plane of circuitry 203b (FIGS. 5A-5D). The first and second planes of circuitry parallel but not coplanar.

In step 408 a first composite word line, equivalent to a first particular word line in the at least two word lines, is formed by connecting corresponding word line portions in the first and third array portions and is further connected to a first word line driver using an interconnection between the first and second planes of circuitry. A second composite word line, equivalent to a second particular word line in the at least two word lines is formed by connecting corresponding word line portions in the second and fourth array portions and is further connected to a second word line driver.

In step 409, a first composite bit line, the first composite bit line being equivalent to a first bit line in the at least two bit lines of the array, is formed by interconnecting a bit line portion on the first array portion (138a in FIG. 8) with a bit line portion on the second array portion (138b in FIG. 8) as shown in FIG. 8, see bit line $140_0$ or $140_1$. A second composite bit line, equivalent to a second bit line in the at least two bit lines of the array, is formed by interconnecting a bit line portion on the third array portion (138c in FIG. 8) with a bit line portion on the fourth array portion (138d in FIG. 8) as shown in FIG. 8, see bit line $140_8$ or $140_9$. Step 412 ends method 400.

What is claimed is:

1. A semiconductor storage comprising:
   a first plane of circuitry;
   a second plane of circuitry, the second plane of circuitry being parallel to, and not coplanar with, the first plane of circuitry;
   a first array portion formed on the first plane of circuitry;
   a second array portion formed on the second plane of circuitry;
   at least a first composite word line or a first composite bit line, the first composite word line having a first word line portion on the first array portion and a second word line portion on the second array portion, the first composite bit line having a first bit line portion on the first array portion and a second bit line portion on the second array portion; and
   an interconnect connecting a proximal end of the first word line portion and a proximal end the second word line portion, or a proximal end of the first bit line portion and a proximal end of the second bit line portion.

2. The semiconductor storage of claim 1, further comprising a semiconductor substrate having a first surface and a second, opposing, surface;
   wherein the first plane of circuitry is on the first surface and the second plane of circuitry is on the second surface; and
   wherein the interconnect traverses the first substrate.

3. The semiconductor storage of claim 1, further comprising:
   a first semiconductor substrate having the first plane of circuitry on a first top side of the first semiconductor substrate as viewed from the side;
   a second semiconductor substrate having the second plane of circuitry on a second top side of the second semiconductor substrate as viewed from the side;
   an insulator placed between a bottom side of the first substrate and the second plane of circuitry;
   wherein the interconnect traverses the insulator and the first substrate.

4. The semiconductor storage of claim 1, further comprising:
   a first semiconductor substrate having the first plane of circuitry on a top side of the first semiconductor substrate as viewed from the side;
   a second semiconductor substrate having the second plane of circuitry on a bottom side of the second semiconductor substrate as viewed from the side; and
   an insulator placed between a bottom side of the first substrate and the second plane of circuitry;
   wherein the interconnect traverses the insulator.

5. The semiconductor storage of claim 1 wherein a first signal propagation time from a proximal end of the first composite word line to a distal end of the first composite word line is less than one third of a series signal propagation time that would occur for a series configuration of the first word line portion and the second word line portion of the composite word line.

6. The semiconductor storage of claim 1 further comprising:
   a word line driver connected to the interconnect.

7. The semiconductor storage of claim 6, further comprising:
   a first storage cell in the first array portion, the first storage cell coupled to the first word line portion;

a second storage cell in the second array portion, the second storage cell coupled to the second word line portion;

a first bit line coupled to the first storage cell, the first bit line connected to a first bit line driver; and a second bit line coupled to the second storage cell, the second bit line connected to a second bit line driver.

8. The semiconductor storage of claim 1, further comprising:

a first bit line driver connected to the interconnect.

9. The semiconductor storage of claim 8, further comprising:

a third array portion;

a fourth array portion; and a second composite bit line further comprising:

a third bit line portion in the third array portion, the third bit line portion having a third proximal end;

a fourth bit line portion in the fourth array portion, the fourth bit line portion having a fourth proximal end;

a second interconnect connecting the third proximal end and the fourth proximal end; and a second bit line driver connected to the second interconnect.

10. The semiconductor storage of claim 9 further comprising:

a first coplanar composite word line having a first word line portion in the first array portion and a second word line portion in the third array portion; and a second coplanar composite word line having a third word line portion in the second array portion and a fourth word line portion in the fourth array portion.

11. The semiconductor storage of claim 10, further comprising:

a first word line driver that is physically placed between the second array portion and the fourth array portion on the second plane of circuitry, the first word line driver configured to drive a proximal end of the first word line portion and a proximal end of the second word line portion; and a second word line driver that is physically placed between the second array portion and the fourth array portion on the second plane of circuitry, the second word line driver configured to drive a proximal end of the third word line portion and a proximal end of the fourth word line portion.

12. A computer system comprising the semiconductor storage of claim 1.

13. A method comprising the steps of:

partitioning an array, in a semiconductor storage into a first array portion and a second array portion;

placing the first array portion on a first plane of circuitry;

placing the second array portion on a second plane of circuitry, the second plane of circuitry parallel but not coplanar with the first array portion;

using an interconnect to connect a composite word line or a composite bit line to reduce signal propagation times in a distributed RC (resistor capacitor) conductor in the semiconductor storage.

14. The method of claim 13, further comprising:

creating a first composite word line further comprising a first word line portion in the first array portion and a second word line portion in the second array portion;

connecting a proximal end of the first word line portion and a proximal end of the second word line portion using a first interconnect and connecting a word line driver to the first interconnect.

15. The method of claim 14, further comprising:

placing one or more bit lines in the first array portion;

placing one or more bit lines in the second array portion;

wherein at least one of the one or more bit lines in the first array portion is not logically identical to any of the one or more bit lines in the second array portion.

16. The method of claim 13, further comprising:

creating a first composite bit line further comprising a first bit line portion in the first array portion and a second bit line portion in the second array portion;

connecting a proximal end of the first bit line portion and a proximal end of the second bit line portion using a second interconnect; and connecting a first bit line driver to the second interconnect.

17. The method of claim 16, further comprising the steps of:

partitioning the array into a third array portion and a fourth array portion;

creating a second composite bit line further comprising a third bit line portion in the third array and a fourth bit line portion in the fourth array portion;

connecting a proximal end of the third bit line portion and a proximal end of the fourth bit line portion using a third interconnect; and connecting a second bit line driver to the third interconnect.

18. The method of claim 17, further comprising the steps of:

creating a second composite word line, the second composite word line having a third word line portion in the first array portion and a second word line portion in the third array portion;

connecting a proximal end of the third word line portion to a proximal end of the fourth word line portion; and connecting a second word line driver to the proximal ends of the third and fourth word line portions.

* * * * *